(12) United States Patent
Yumoto et al.

(10) Patent No.: US 11,735,434 B2
(45) Date of Patent: Aug. 22, 2023

(54) METHOD FOR PRODUCING INSULATING CIRCUIT SUBSTRATE WITH HEAT SINK

(71) Applicant: MITSUBISHI MATERIALS CORPORATION, Tokyo (JP)

(72) Inventors: Ryouhei Yumoto, Saitama (JP); Tomoya Oohiraki, Nagareyama (JP); Takeshi Kitahara, Saitama (JP); Yoshiyuki Nagatomo, Saitama (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 613 days.

(21) Appl. No.: 16/488,634

(22) PCT Filed: Feb. 28, 2018

(86) PCT No.: PCT/JP2018/007605
§ 371 (c)(1),
(2) Date: Aug. 26, 2019

(87) PCT Pub. No.: WO2018/180159
PCT Pub. Date: Oct. 4, 2018

(65) Prior Publication Data
US 2021/0134609 A1     May 6, 2021

(30) Foreign Application Priority Data

Mar. 29, 2017   (JP) ................................. 2017-064878

(51) Int. Cl.
*H01L 21/48*        (2006.01)
*C04B 37/02*        (2006.01)
(Continued)

(52) U.S. Cl.
CPC ........ *H01L 21/4882* (2013.01); *C04B 37/021* (2013.01); *H01L 23/3735* (2013.01);
(Continued)

(58) Field of Classification Search
None
See application file for complete search history.

(56) References Cited

U.S. PATENT DOCUMENTS 7,323,255 B2 *   1/2008   Tanaka ................ H01L 23/3735
                                                            257/713
2006/0157862 A1   7/2006   Nishimura et al.
(Continued)

FOREIGN PATENT DOCUMENTS

CN     102194765 A    9/2011
CN     107534033 A    1/2018
(Continued)

OTHER PUBLICATIONS

Notice of Allowance dated Sep. 7, 2021, issued for Japanese Patent Application No. 2018-043491 and English translation thereof.
(Continued)

*Primary Examiner* — Seth Dumbris
(74) *Attorney, Agent, or Firm* — Locke Lord LLP (57) ABSTRACT

A method is provided for producing an insulating circuit substrate with a heat sink including an insulating circuit substrate and a heat sink, the insulating circuit substrate including a circuit layer and a metal layer that are formed on an insulating layer, and the heat sink being bonded to the metal layer side. The method includes: an aluminum bonding layer forming step of forming an aluminum bonding layer formed of aluminum or an aluminum alloy having a solidus temperature of 650° C. or lower on the metal layer; and a heat sink bonding step of laminating a copper bonding material formed of copper or a copper alloy between the aluminum bonding layer and the heat sink and bonding the aluminum bonding layer, the copper bonding material, and the heat sink to each other by solid phase diffusion bonding.

7 Claims, 7 Drawing Sheets

(51) Int. Cl.
*H01L 23/373* (2006.01)
*H05K 1/02* (2006.01)
*H05K 1/03* (2006.01)
*H05K 3/20* (2006.01)

(52) U.S. Cl.
CPC ......... *H05K 1/0203* (2013.01); *H05K 1/0306* (2013.01); *H05K 3/20* (2013.01); *C04B 2237/343* (2013.01); *C04B 2237/366* (2013.01); *C04B 2237/368* (2013.01); *C04B 2237/402* (2013.01); *C04B 2237/704* (2013.01); *C04B 2237/706* (2013.01)

(56) References Cited

U.S. PATENT DOCUMENTS

| | | | |
|---|---|---|---|
| 2015/0034367 A1* | 2/2015 | Nagatomo | B23K 20/16 174/257 |
| 2015/0251382 A1 | 9/2015 | Terasaki et al. | |
| 2018/0040535 A1 | 2/2018 | Terasaki et al. | |

FOREIGN PATENT DOCUMENTS

| | | |
|---|---|---|
| JP | 06-108246 A | 4/1994 |
| JP | 11-286704 A | 10/1999 |
| JP | 2000-281468 A | 10/2000 |
| JP | 3171234 B2 | 5/2001 |
| JP | 2003-306730 A | 10/2003 |
| JP | 2009-105166 A | 5/2009 |
| JP | 2013-058535 A | 3/2013 |
| JP | 2014-060215 A | 4/2014 |
| JP | 2014/112732 A | 6/2014 |
| JP | 2015-155108 A | 8/2015 |
| JP | 2016-041434 A | 3/2016 |
| JP | 2016-042528 A | 3/2016 |
| JP | 2016-076507 A | 5/2016 |
| JP | 2016-100430 A | 5/2016 |
| JP | 2016-189448 A | 11/2016 |
| JP | 2016-208010 A | 12/2016 |
| TW | 201405721 A | 2/2014 |
| WO | 2016/060079 A1 | 4/2016 |

OTHER PUBLICATIONS

Office Action dated Jan. 20, 2021, issued for Taiwanese patent application No. 107106776 and English translation thereof.
International Search Report dated May 15, 2018, issued for PCT/JP2018/007605 and English translation thereof.
Office Action dated Nov. 10, 2022, issued for Chinese Patent Application No. 201880012550.1 and English translation of the Search Report.
Office Action dated Jun. 26, 2023, issued for CN201880012550.1 and an English Partial Machine Translation thereof.

* cited by examiner

METHOD FOR PRODUCING INSULATING CIRCUIT SUBSTRATE WITH HEAT SINK

TECHNICAL FIELD

The present invention relates to a method for producing an insulating circuit substrate with a heat sink including an insulating circuit substrate and a heat sink, the insulating circuit substrate including a circuit layer that is formed on a first surface of an insulating layer and a metal layer that is formed on a second surface of the insulating layer, and the heat sink being bonded to the metal layer side of the insulating circuit substrate.

Priority is claimed on Japanese Patent Application No. 2017-064878, filed on Mar. 29, 2017, the content of which is incorporated herein by reference.

BACKGROUND ART

A power module, a LED module, or a thermoelectric module has a structure in which a power semiconductor element, a LED element, or a thermoelectric element is bonded to an insulating circuit substrate in which a circuit layer formed of a conductive material is formed on a first surface of an insulating layer.

In a power semiconductor element for high power control that is used for controlling wind power generation, an electric vehicle, a hybrid vehicle, or the like, the amount of heat generated during an operation is large. As a substrate on which the power semiconductor element is mounted, for example, an insulating circuit substrate is widely used in the related art, the insulating circuit substrate including: a ceramic substrate that is formed of aluminum nitride, silicon nitride, or the like; and a circuit layer that is formed by bonding a metal plate having excellent conductivity to a first surface of the ceramic substrate. As the insulating circuit substrate, an insulating circuit substrate including a metal layer that is formed by bonding a metal plate to a second surface of the ceramic substrate is also provided.

For example, PTL 1 discloses an insulating circuit substrate including a circuit layer and a metal layer that are formed on a first surface and a second surface of a ceramic substrate, respectively, using an aluminum plate or a copper plate. A heat sink is bonded to a second surface side of the insulating circuit substrate such that heat transmitted from a semiconductor element to the insulating circuit substrate side is dissipated to the outside via the heat sink.

As a material of the heat sink, an aluminum alloy or an aluminum material such as aluminum-based composite material disclosed in PTL 2 in which a silicon carbide member represented by AlSiC is filled with aluminum or an aluminum alloy is widely used. When the heat sink is formed of an aluminum alloy having a low solidus temperature, the heat sink can be formed in a shape having a relatively complex structure, and heat radiation can be improved. When the heat sink is formed of an aluminum-based composite material in which a silicon carbide member is filled with aluminum or an aluminum alloy, the thermal expansion coefficient is close to that of the insulating circuit substrate such that a thermal strain during loading of a thermal cycle can be suppressed to be low.

As means for bonding a metal layer formed of aluminum or an aluminum alloy and a heat sink formed of an aluminum material to each other, for example, PTL 3 discloses a method of providing a bonding material formed of copper or a copper alloy between a metal layer and a heat sink formed of aluminum or an aluminum alloy and bonding the metal layer and the bonding material to each other and bonding the bonding material and the heat sink to each other by solid phase diffusion bonding.

CITATION LIST

Patent Literature

[PTL 1] Japanese Patent No. 3171234
[PTL 2] Japanese Unexamined Patent Application, First Publication No. 2000-281468
[PTL 3] Japanese Unexamined Patent Application, First Publication No. 2014-060215

DISCLOSURE OF INVENTION

Technical Problem

Recently, the size and thickness of a power module have been reduced, and the usage environment thereof has also become stricter. Therefore, the amount of heat generated from a semiconductor element has increased, conditions of a thermal cycle have become stricter, and an insulating circuit substrate with a heat sink having excellent bonding reliability and excellent heat radiation as compared to the related art has been required.

In the insulating circuit substrate, the metal layer is formed of a metal having a relatively low deformation resistance, for example, aluminum (4N aluminum) having a purity of 99.99 mass % or higher such that a thermal strain during loading of a thermal cycle is absorbed by deformation of the metal layer and cracking or the like of the insulating layer can be suppressed.

When the metal layer is formed of 4N aluminum, a bonding surface of the heat sink is formed of an aluminum alloy such as ADC12, and the metal layer and the bonding surface of the heat sink are bonded to each other by solid phase diffusion bonding using the method described in PTL 3, there is a large difference in solidus temperature between the metal layer and the bonding surface of the heat sink. Therefore, it is necessary that a temperature condition during solid phase diffusion bonding be lower than the solidus temperature of the aluminum alloy. In 4N aluminum having a high purity, the diffusion energy is high, and a diffusion phenomenon is not likely to occur. Therefore, solid phase diffusion between Al of the metal layer formed of 4N aluminum having a high solidus temperature and Cu of the bonding material is insufficient, and bonding reliability between the metal layer and the heat sink may deteriorate.

An object of the present invention is to provide a method for producing an insulating circuit substrate with a heat sink in which a metal layer and a heat sink can be reliably bonded to each other by solid phase diffusion bonding even when the metal layer is formed of aluminum or an aluminum alloy having a relatively low deformation resistance and a bonding surface of the heat sink is formed of aluminum or an aluminum alloy having a relatively low solidus temperature.

Solution to Problem

According to the present invention, a method is provided for producing an insulating circuit substrate with a heat sink including an insulating circuit substrate and a heat sink, the insulating circuit substrate including a circuit layer that is formed on a first surface of an insulating layer and a metal layer that is formed on a second surface of the insulating layer, and the heat sink being bonded to the metal layer side of the insulating circuit substrate. The metal layer is formed of aluminum or an aluminum alloy, and an indentation hardness of the metal layer is lower than 50 mgf/µm². A bonding surface of the heat sink with the insulating circuit substrate is formed of aluminum or an aluminum alloy having a solidus temperature of 650° C. or lower. This production method includes: an aluminum bonding layer forming step of forming an aluminum bonding layer formed of aluminum or an aluminum alloy having a solidus temperature of 650° C. or lower on a surface of the metal layer opposite to the insulating layer; and a heat sink bonding step of bonding the heat sink to the aluminum bonding layer by laminating a copper bonding material formed of copper or a copper alloy between the aluminum bonding layer and a bonding surface of the heat sink and bonding the aluminum bonding layer and the copper bonding material to each other and bonding the copper bonding material and the heat sink to each other by solid phase diffusion bonding. Solid phase diffusion bonding refers to a method of diffusing atoms from a bonding material to a bonding surface while maintaining the bonding material to be in a solid phase state without entering a liquid phase state.

In this method, a difference in solidus temperature between the aluminum or the aluminum alloy forming the aluminum bonding layer and the aluminum or the aluminum alloy forming the bonding surface of the heat sink can be made to be small, and even when solid phase diffusion bonding is performed under a relatively low-temperature condition, Al of the aluminum bonding layer and Cu of the copper bonding material can be sufficiently diffused, Cu of the copper bonding material and Al of the bonding surface of the heat sink can be sufficiently diffused, and the insulating circuit substrate and the heat sink can be reliably bonded to each other.

The metal layer is formed of aluminum or an aluminum alloy, and an indentation hardness of the metal layer is lower than 50 mgf/µm². Therefore, during loading of a thermal cycle on the insulating circuit substrate with a heat sink, a thermal strain can be released by deforming the metal layer, and the cracking or the like of the insulating layer can be suppressed. Further, the bonding surface of the heat sink is formed of aluminum or an aluminum alloy having a solidus temperature of 650° C. or lower. Therefore, a heat sink suitable for required performance can be configured. Specifically, the indentation hardness is a value measured using a method according to ISO 14577.

It is preferable that a ratio tb/ta of a thickness tb of the metal layer to a thickness ta of the aluminum bonding layer be in a range of 0.08 to 40. In addition, the ratio tb/ta of the thickness tb of the metal layer to the thickness ta of the aluminum bonding layer is 0.08 or higher. Therefore, the thickness of the metal layer formed of aluminum or an aluminum alloy can be secured, a thermal strain during loading of a thermal cycle can be absorbed by the metal layer, and the cracking or the like of the insulating layer can be suppressed.

On the other hand, the ratio tb/ta of the thickness tb of the metal layer to the thickness to of the aluminum bonding layer is 40 or lower. Therefore, for example, when the metal layer and the aluminum bonding layer are brazed, a brazing material (liquid phase) erodes the aluminum bonding layer, and a grain boundary melts. As a result, unevenness is generated on a surface (a surface opposite to the metal layer) of the aluminum bonding layer, and voids derived from the generated unevenness are not formed between the aluminum bonding layer and the copper bonding material, and thus the aluminum bonding layer and the copper bonding material can be favorably bonded to each other.

It is preferable that a total thickness of the metal layer and the aluminum bonding layer be 2.0 mm or less. In this case, the total thickness of the metal layer and the aluminum bonding layer is 2.0 mm or less. Therefore, the total thickness of the metal layer and the aluminum bonding layer interposed between the insulating layer and the heat sink is not larger than necessary, a thermal resistance in the laminating direction can be suppressed, and heat radiation can be secured.

Advantageous Effects of Invention

According to the present invention, a metal layer and a heat sink can be reliably bonded to each other by solid phase diffusion bonding even when the metal layer is formed of aluminum or an aluminum alloy having a relatively low deformation resistance and a bonding surface of the heat sink is formed of aluminum or an aluminum alloy having a relatively low solidus temperature.

BEST MODE FOR CARRYING OUT THE INVENTION

Hereinafter, an embodiment of the present invention will be described with reference to the accompanying drawings.

Figure 1:
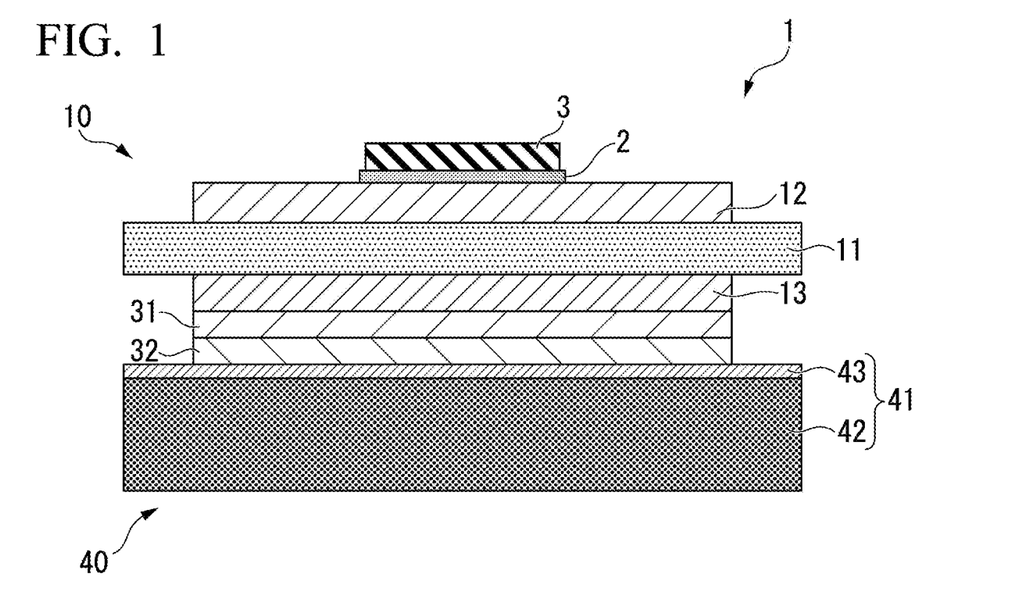
FIG. 1 is a cross-sectional view illustrating a power module including an insulating circuit substrate with a heat sink produced according to an embodiment of the present invention.

FIG. 1 illustrates an insulating circuit substrate with a heat sink 40 produced using a method for producing an insulating circuit substrate with a heat sink according to the embodiment of the present invention and a power module 1 in which the insulating circuit substrate with a heat sink 40 is used.

The power module 1 illustrated in FIG. 1 includes: an insulating circuit substrate 10; a semiconductor element 3 that is bonded to a first surface (in FIG. 1, an upper surface) of the insulating circuit substrate 10 via a solder layer 2; and a heat sink 41 that is bonded to a lower side of the insulating circuit substrate 10. The insulating circuit substrate 10 to which the heat sink 41 is bonded is the insulating circuit substrate with a heat sink 40 according to the embodiment.

The semiconductor element 3 is formed of a semiconductor material such as Si. The solder layer 2 that bonds the insulating circuit substrate 10 and the semiconductor element 3 to each other is not particularly limited and is preferably, for example, a Sn—Ag-based solder material, a Sn—Cu-based solder material, a Sn—In-based solder material, or a Sn—Ag—Cu-based solder material (so-called lead-free solder material).

As illustrated in FIG. 1, the insulating circuit substrate 10 includes: a ceramic substrate 11 that is an insulating layer; a circuit layer 12 that is provided on a first surface (in FIG. 1, an upper surface) of the ceramic substrate 11; and a metal layer 13 that is provided on a second surface (in FIG. 1, a lower surface) of the ceramic substrate 11. Planar shapes of the circuit layer 12, the ceramic substrate 11, and the metal layer 13 may be a rectangular shape or the like as necessary. In this embodiment, the dimension of the ceramic substrate 11 is larger than those of the circuit layer 12 and the metal layer 13 to obtain high insulating properties.

The ceramic substrate 11 is not particularly limited as long as it prevents electrical connection between the circuit layer 12 and the metal layer 13. For example, the ceramic substrate 11 may be formed of aluminum nitride (AlN), silicon nitride ($Si_3N_4$), or alumina ($Al_2O_3$) having high insulating properties and is preferably aluminum nitride. The thickness of the ceramic substrate 11 is not particularly limited, is preferably set in a range of 0.2 mm to 1.5 mm, and is set as 0.635 mm in the embodiment.

Figure 5:
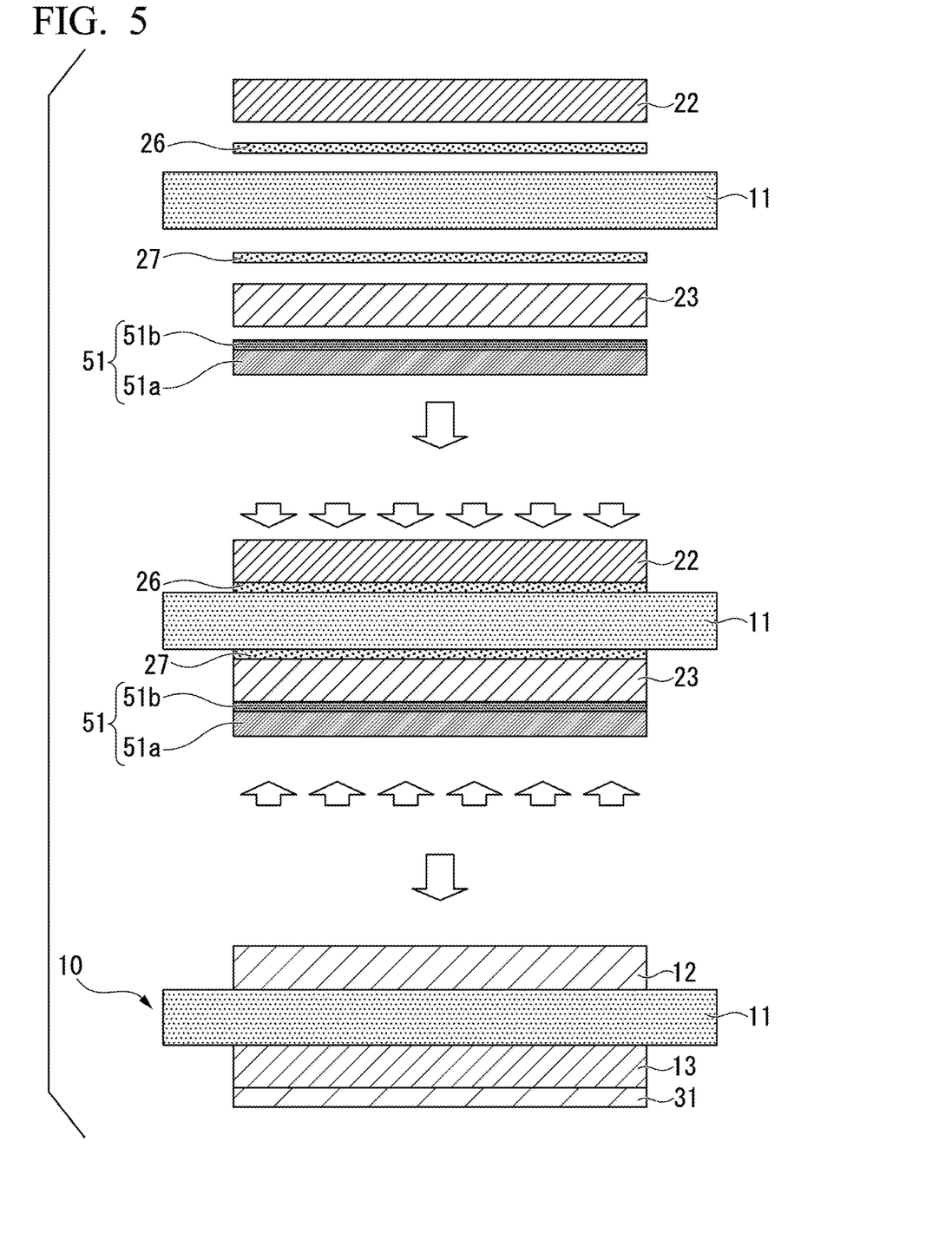
FIG. 5 is a cross-sectional view illustrating the method for producing the insulating circuit substrate with a heat sink according to the embodiment of the present invention.

The circuit layer 12 is formed by bonding a metal plate having conductivity to the first surface of the ceramic substrate 11. In the embodiment, as illustrated in FIG. 5, the circuit layer 12 is formed by bonding an aluminum plate 22 formed of aluminum or an aluminum alloy. Specifically, the aluminum plate 22 forming the circuit layer 12 is not particularly limited, and a rolled plate of aluminum (2N aluminum) having a purity of 99 mass % or higher or an aluminum alloy such as A3003 or A6063 is preferably used.

A circuit pattern is formed on the circuit layer 12, and a first surface (in FIG. 1, an upper surface) of the circuit layer 12 is a mounting surface on which the semiconductor element 3 is mounted. The thickness of the circuit layer 12 is not particularly limited, is preferably set in a range of 0.1 mm to 2.0 mm, and may be set as 0.4 mm The metal layer 13 is formed by bonding an aluminum plate 23 formed of aluminum or an aluminum alloy to the second surface of the ceramic substrate 11. An indentation hardness of the metal layer 13 is lower than 50 mgf/$\mu m^2$. The indentation hardness is a value of the insulating circuit substrate with a heat sink 40 at 25° C. Specifically, the indentation hardness is a value measured using a method according to ISO 14577.

As the aluminum plate 23 forming the metal layer 13, for example, aluminum (2N aluminum) having a purity of 99 mass % or higher, aluminum (3N aluminum) having a purity of 99.9 mass % or higher, or aluminum (4N aluminum) having a purity of 99.99 mass % or higher can be used.

In the embodiment, it is preferable that a rolled plate of aluminum (4N aluminum) having a purity of 99.99 mass % or higher be used as the aluminum plate 23 forming the metal layer 13. A thickness tb of the metal layer 13 is not particularly limited, is preferably set in a range of 0.1 mm to 2.0 mm, and may be set as, for example, 0.30 mm The heat sink 41 is provided to cool the insulating circuit substrate 10 and, as illustrated in FIG. 1, is a heat radiation plate formed of a material having excellent thermal conductivity.

The heat sink 41 is not particularly limited and is preferably formed of an Al—SiC composite material (so-called AlSiC) of a porous body formed of SiC and an aluminum material formed of aluminum or an aluminum alloy impregnated into the porous body. As the aluminum material impregnated into the porous body formed of SiC, ADC12 (solidus temperature: 570° C.) can be used.

Figure 3:
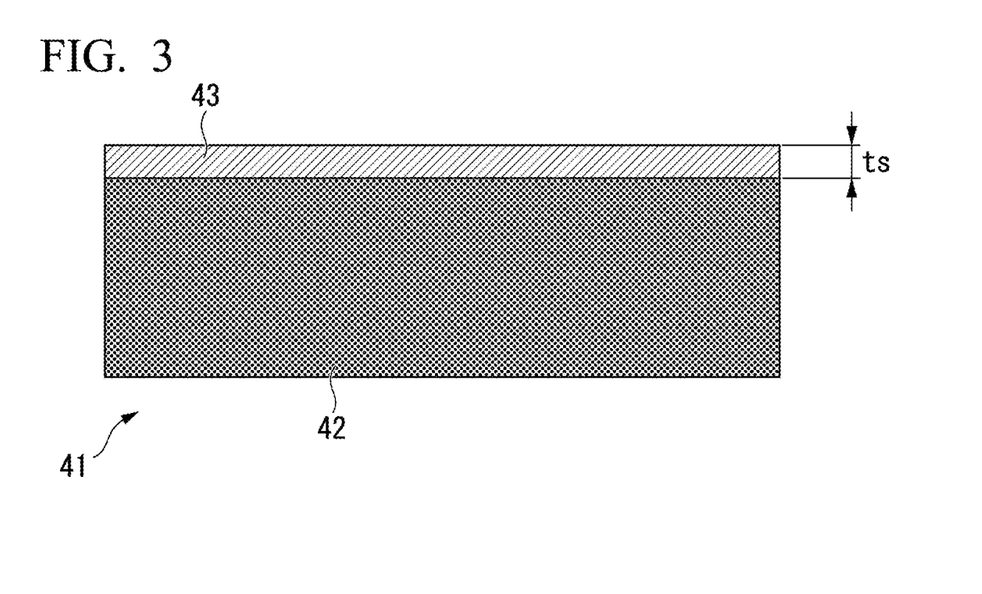
FIG. 3 is a cross-sectional view illustrating the heat sink used in the insulating circuit substrate with a heat sink illustrated in FIG. 1.

In the heat sink 41, as illustrated in FIG. 3, a skin layer 43 formed of an aluminum material (in the embodiment, ADC12) impregnated into a porous body is formed on a surface of a heat sink main body 42 formed of AlSiC.

The thickness of the heat sink main body 42 is not particularly limited and is preferably in a range of 0.5 mm to 5.0 mm. A thickness is of the skin layer 43 is preferably 0.01 times to 0.1 times of the thickness of the heat sink main body 42.

Figure 2:
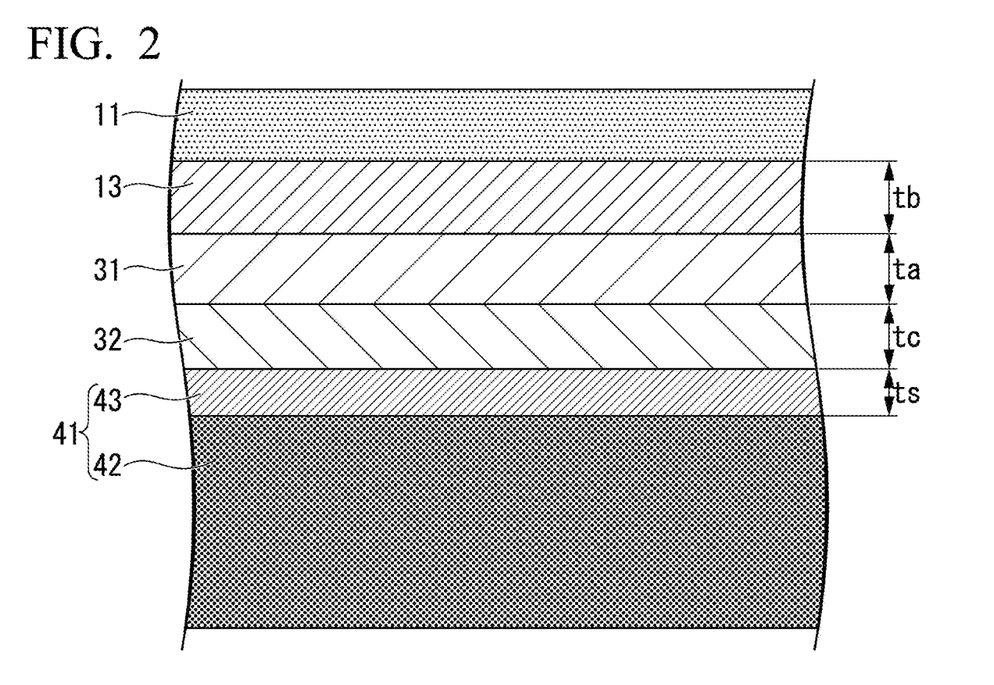
FIG. 2 is an enlarged cross-sectional view illustrating a bonded interface between a metal layer and a heat sink in the insulating circuit substrate with a heat sink illustrated in FIG. 1.

The metal layer 13 of the insulating circuit substrate 10 and the heat sink 41 are bonded to each other via an aluminum bonding layer 31 and a copper bonding layer 32.

The aluminum bonding layer 31 is formed of aluminum or an aluminum alloy having a solidus temperature of 650° C. or lower, and is preferably formed of an A3003 alloy (solidus temperature: 643° C.).

A temperature difference between the solidus temperature of the aluminum bonding layer 31 and the solidus temperature of the aluminum alloy forming a bonding surface (in the embodiment, the skin layer 43) of the heat sink 41 is preferably in a range of 80° C. or lower.

A thickness to of the aluminum bonding layer 31 is not particularly limited, is preferably set in a range of 0.03 mm to 1.5 mm, and may be set as 0.1 mm in the embodiment.

A ratio tb/ta of the thickness tb of the metal layer 13 to the thickness to of the aluminum bonding layer 31 is not particularly limited and is preferably in a range of 0.08 to 40. The total thickness (ta+tb) of the metal layer 13 and the aluminum bonding layer 31 may be 2.0 mm or less. It is preferable that the metal layer 13 and the aluminum bonding layer 31 be bonded to each other by bonding using a brazing material or solid phase diffusion bonding.

Figure 6:
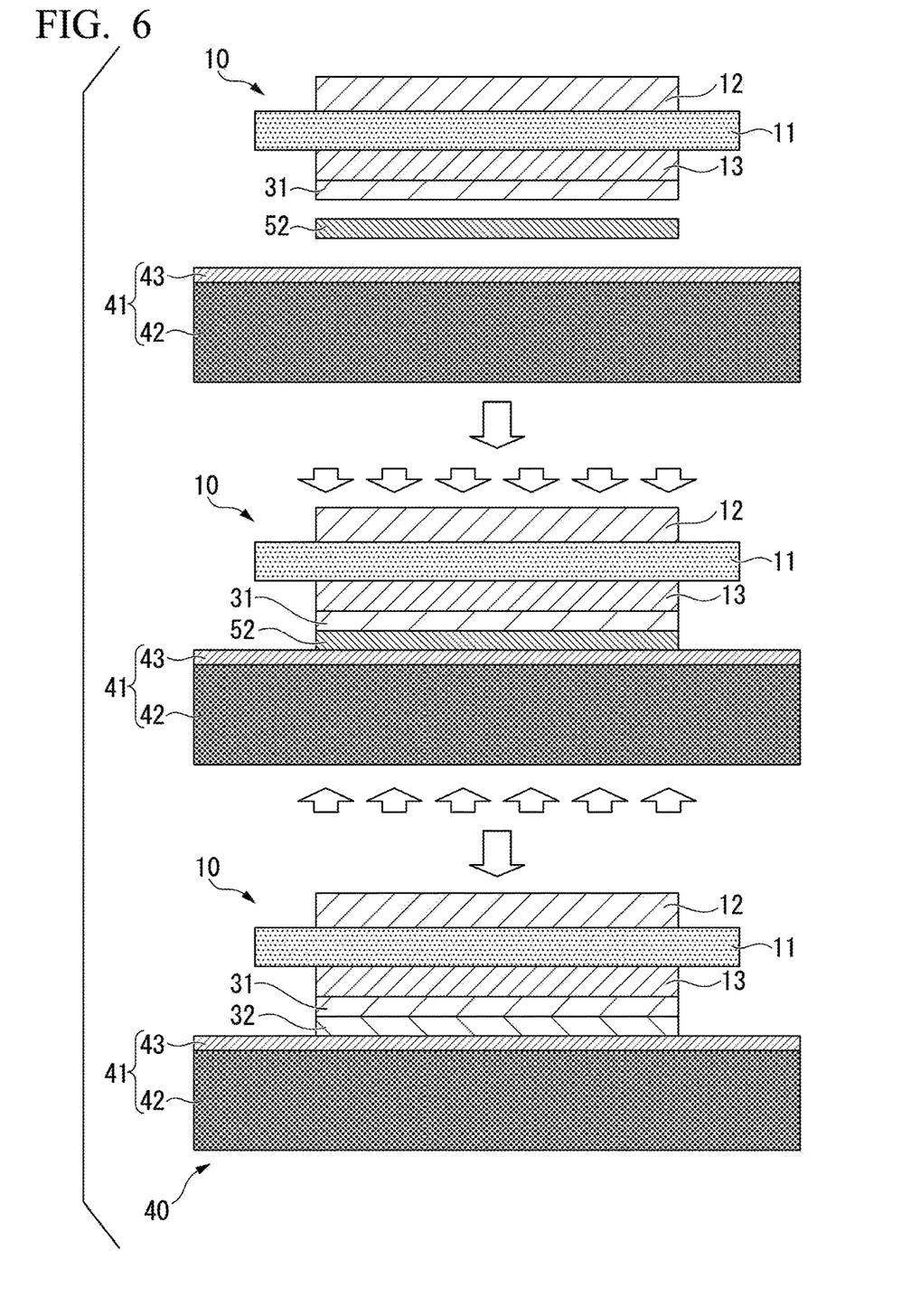
FIG. 6 is a cross-sectional view illustrating the method for producing the insulating circuit substrate with a heat sink according to the embodiment of the present invention.

The copper bonding layer 32 is formed of copper or a copper alloy. In the embodiment, as illustrated in FIG. 6, the copper bonding layer 32 is formed by bonding a copper plate 52 formed of a rolled plate of oxygen free copper. A thickness tc of the copper bonding layer 32 is not particularly limited and is preferably in a range of 0.05 mm to 5.0 mm. The aluminum bonding layer 31 and the copper bonding layer 32 are bonded to each other and the copper bonding layer 32 and the heat sink 41 (skin layer 43) are bonded to each other by solid phase diffusion bonding.

Figure 4:
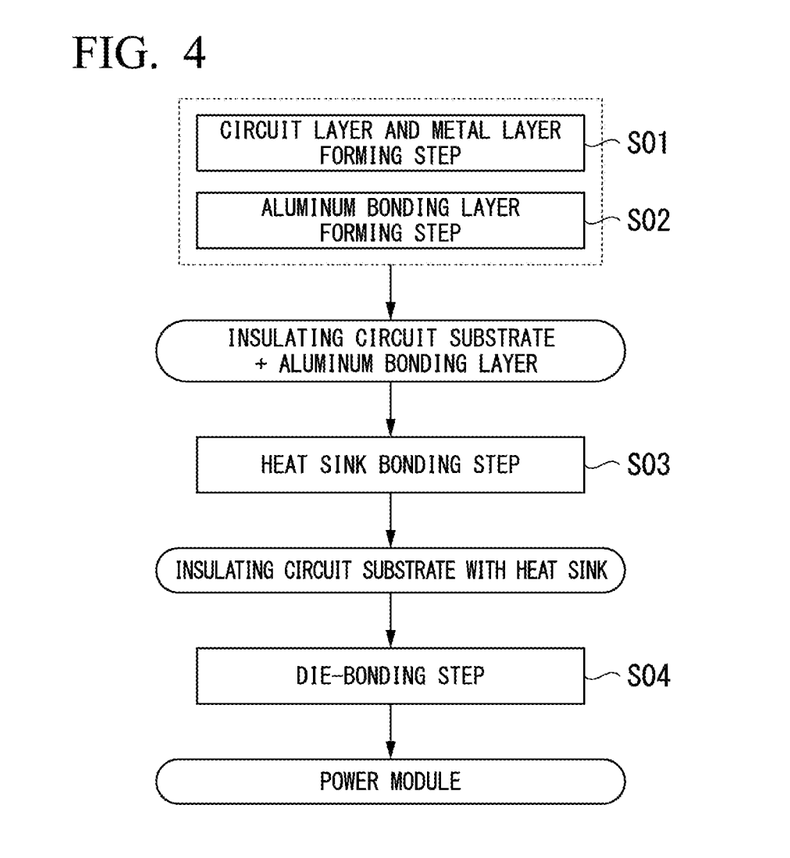
FIG. 4 is a flowchart illustrating an embodiment of a method for producing the insulating circuit substrate with a heat sink according to the present invention.

Next, a method for producing the insulating circuit substrate with a heat sink 40 according to the embodiment will be described with reference to FIGS. 4 to 6.

(Circuit Layer and Metal Layer Forming Step S01/Aluminum Bonding Layer Forming Step S02)

First, as illustrated in FIG. 5, the aluminum plates 22 and 23 are laminated on the first surface and the second surface of the ceramic substrate 11 via brazing materials 26 and 27. As the brazing materials 26 and 27, an Al—Si-based brazing material or an Al—Si—Mg-based brazing material is preferably used.

A clad material 51 that forms the aluminum bonding layer 31 is laminated on a second surface side (in FIG. 5, a lower side) of the aluminum plate 23 that forms the metal layer 13.

The clad material 51 includes a main body layer 51a formed of A3003 alloy and a brazing material layer 51b formed of A4045 alloy, and the main body layer 51a forms the aluminum bonding layer 31. As illustrated in FIG. 5, the clad material 51 is laminated such that the brazing material layer 51b faces the aluminum plate 23 side that forms the metal layer 13.

In a state where the aluminum plate 22, the ceramic substrate 11, the aluminum plate 23, and the clad material 51 are pressurized in a laminating direction, the laminated body is heated. As a result, the ceramic substrate 11 and the aluminum plates 22 and 23 are bonded to each other to form the circuit layer 12 and the metal layer 13, and the metal layer 13 and the clad material 51 are bonded to each other to form the aluminum bonding layer 31. That is, in the embodiment, the circuit layer and metal layer forming step S01 and the aluminum bonding layer forming step S02 are performed at once.

Bonding conditions in the circuit layer and metal layer forming step S01 and the aluminum bonding layer forming step S02 are preferably set as follows: the atmosphere is a vacuum, the pressurization load is in a range of 0.1 MPa to 3.5 MPa, and the heating temperature is in a range of 560° C. to 630° C. As described above, the insulating circuit substrate 10 and the aluminum bonding layer 31 according to the embodiment are formed.

(Heat Sink Bonding Step S03)

Next, as illustrated in FIG. 6, the heat sink 41 is laminated on the second surface side (in FIG. 6, a lower side) of the aluminum bonding layer 31 via the copper plate 52 as a copper bonding material formed of a rolled plate of oxygen free copper. The heat sink 41 is laminated such that the skin layer 43 faces the copper plate 52 side.

The insulating circuit substrate 10, the insulating circuit substrate 10 to which the aluminum bonding layer 31 is bonded, the copper plate 52, and the heat sink 41 are pressurized in the laminating direction and heated. As a result, the aluminum bonding layer 31 and the copper plate 52 are bonded to each other and the copper plate 52 and the heat sink 41 (skin layer 43) are bonded to each other by solid phase diffusion bonding.

In the embodiment, as solid phase diffusion conditions, a load in the laminating direction is preferably in a range of 6 kgf/cm2 to 35 kgf/cm2 (0.6 MPa to 3.5 MPa).

The bonding temperature is in a range of 460° C. to 540° C. and preferably in a range of 480° C. to 520° C. The holding time is preferably in a range of 30 min to 240 min Through the above-described steps, the insulating circuit substrate with a heat sink 40 according to the embodiment is produced.

(Die-Bonding Step S04)

Next, the semiconductor element 3 is laminated on the circuit layer 12 of the insulating circuit substrate with a heat sink 40 via a solder material, and the circuit layer 12 of the insulating circuit substrate with a heat sink 40 and the semiconductor element 3 are bonded to each other in a reducing furnace.

The power module 1 illustrated in FIG. 1 is produced as described above.

The above-described production method includes: the aluminum bonding layer forming step S02 of forming the aluminum bonding layer 31 formed of aluminum or an aluminum alloy having a solidus temperature of 650° C. or lower on a surface of the metal layer 13 opposite to the ceramic substrate 11; and the heat sink bonding step S03 of bonding the heat sink 41 to the aluminum bonding layer by laminating the copper plate 52 formed of copper or a copper alloy between the aluminum bonding layer 31 and a bonding surface of the heat sink 41 and bonding the aluminum bonding layer 31 and the copper plate 52 to each other and bonding the copper plate 52 and the heat sink 41 to each other by solid phase diffusion bonding. Therefore, a difference in solidus temperature between the aluminum or the aluminum alloy forming the aluminum bonding layer 31 and the aluminum or the aluminum alloy forming the bonding surface (skin layer 43) of the heat sink 41 is small, and even when solid phase diffusion bonding is performed under a relatively low-temperature condition, Al of the aluminum bonding layer 31 and Cu of the copper plate 52 can be sufficiently diffused, Cu of the copper plate 52 and Al of the bonding surface of the heat sink 41 can be sufficiently diffused, and the insulating circuit substrate 10 and the heat sink 41 can be reliably bonded to each other.

In the insulating circuit substrate with a heat sink 40 according to the embodiment, the metal layer 13 is formed of aluminum or an aluminum alloy (in the embodiment, 4N aluminum), and the indentation hardness of the metal layer 13 is lower than 50 mgf/um$^2$. Therefore, during loading of a thermal cycle on the insulating circuit substrate with a heat sink 40, a thermal strain can be released by deforming the metal layer 13, and the cracking or the like of the ceramic substrate 11 can be suppressed.

In addition, the heat sink 41 is formed of an Al-SiC composite material (so-called AlSiC) of a porous body formed of SiC and an aluminum material formed of aluminum or an aluminum alloy impregnated into the porous body. Specifically, as the aluminum material impregnated into the porous body formed of SiC, ADC12 (solidus temperature: 570° C.) is used. Therefore, the thermal expansion coefficient of the heat sink 41 is close to the thermal expansion coefficient of the insulating circuit substrate 10, and the occurrence of a thermal strain during loading of a thermal cycle can be suppressed.

In addition, the ratio tb/ta of the thickness tb of the metal layer 13 to the thickness ta of the aluminum bonding layer 31 is 0.08 or higher. Therefore, the thickness of the metal layer 13 formed of aluminum or an aluminum alloy can be secured, a thermal strain during loading of a thermal cycle can be absorbed by the metal layer 13, and the cracking or the like of the ceramic substrate 11 can be suppressed.

On the other hand, the ratio tb/ta of the thickness tb of the metal layer 13 to the thickness ta of the aluminum bonding layer 31 is 40 or lower. Therefore, the thickness of the aluminum bonding layer 31 is not larger than necessary, a thermal resistance in the laminating direction can be suppressed, and heat radiation can be secured.

Further, the total thickness (ta+tb) of the metal layer 13 and the aluminum bonding layer 31 is 2.0 mm or less. Therefore, the total thickness (ta+tb) of the metal layer 13 and the aluminum bonding layer 31 interposed between the ceramic substrate 11 and the heat sink 41 is not large more than necessary, a thermal resistance in the laminating direction can be suppressed, and heat radiation can be secured.

A temperature difference between the solidus temperature of the aluminum bonding layer 31 and the solidus temperature of the aluminum alloy forming the bonding surface (in the embodiment, the skin layer 43) of the heat sink 41 is in a range of 0° C. to 80° C. Therefore, in the heat sink bonding step S03, even when solid phase diffusion bonding is performed under a relatively low-temperature condition, Al of the aluminum bonding layer 31 and Cu of the copper plate 52 can be sufficiently diffused, Cu of the copper plate 52 and Al of the bonding surface of the heat sink 41 can be sufficiently diffused, and the insulating circuit substrate 10 and the heat sink 41 can be reliably bonded to each other by solid phase diffusion bonding.

Hereinabove, the embodiment of the present invention has been described. However, the present invention is not limited to the embodiment, and various modifications can be made within a range not departing from the technical ideas of the present invention.

For example, in the description of the embodiment, aluminum nitride (AlN) is used as the ceramic substrate 11, but the present invention is not limited thereto. The ceramic substrate 11 may be formed of another ceramic such as alumina ($Al_2O_3$) or silicon nitride ($Si_3N_4$). For example, an insulating resin may be used.

In the description, a heat radiation plate is used as the heat sink, but the present invention is not limited thereto. For example, the heat sink may be a cooler including a passage through which a cooling medium passes.

Further, in the description of the embodiment, the heat sink is formed of an Al—SiC composite material (so-called AlSiC) in which an aluminum material formed of ADC12 is impregnated into a porous body formed of SiC, but the present invention is not limited thereto. The material or structure of the bonding surface of the heat sink is not limited as long as the bonding surface of the heat sink is formed of aluminum or an aluminum alloy having a solidus temperature of 650° C. or lower.

Further, in the description of the embodiment, the circuit layer is formed of aluminum or an aluminum alloy, but the present invention is not limited thereto. The circuit layer may be formed of another metal such as copper or a copper alloy, or may have a structure in which an aluminum layer formed of aluminum or an aluminum alloy and a copper layer formed of copper or a copper alloy are laminated.

In the description of the embodiment, the aluminum bonding layer is formed by bonding the clad material to the metal layer. However, the order of the aluminum bonding layer forming step is not particularly limited.

For example, in FIG. 5, the aluminum bonding layer may be formed by laminating an aluminum plate (for example, A3003) that forms the aluminum bonding layer and a brazing material foil (for example, A4045) instead of using the clad material 51. Even in this case, as in the embodiment, the circuit layer and metal layer forming step S01 and the aluminum bonding layer forming step S02 can be performed at once.

When the aluminum bonding layer is formed of aluminum (for example, A5056 alloy (solidus temperature: 582° C.)) having a solidus temperature of 565° C. or higher and lower than 615° C., bonding may be performed using a laminated brazing material in which Mg is laminated on an Al-Si brazing material under conditions of degree of vacuum: $10^{-6}$ Pa to $10^{-3}$ Pa, temperature: 560° C. to 575° C. (not exceeding the solidus temperature), and pressurization load: 0.1 MPa to 3.5 MPa.

When the aluminum bonding layer is formed of aluminum (for example, ADC12 (solidus temperature: 528° C.)) having a solidus temperature of 510° C. or higher and lower than 565° C., by diffusing alloy elements included in ADC12 or the like to the metal layer side as disclosed in Japanese Unexamined Patent Application, First Publication No. 2016-189448, solid phase diffusion bonding may be performed under conditions of degree of vacuum: $10^{-6}$ Pa to $10^{-3}$ Pa, temperature: 400° C. to 560° C., and pressurization load: 0.6 MPa to 3.5 MPa.

Figure 7:
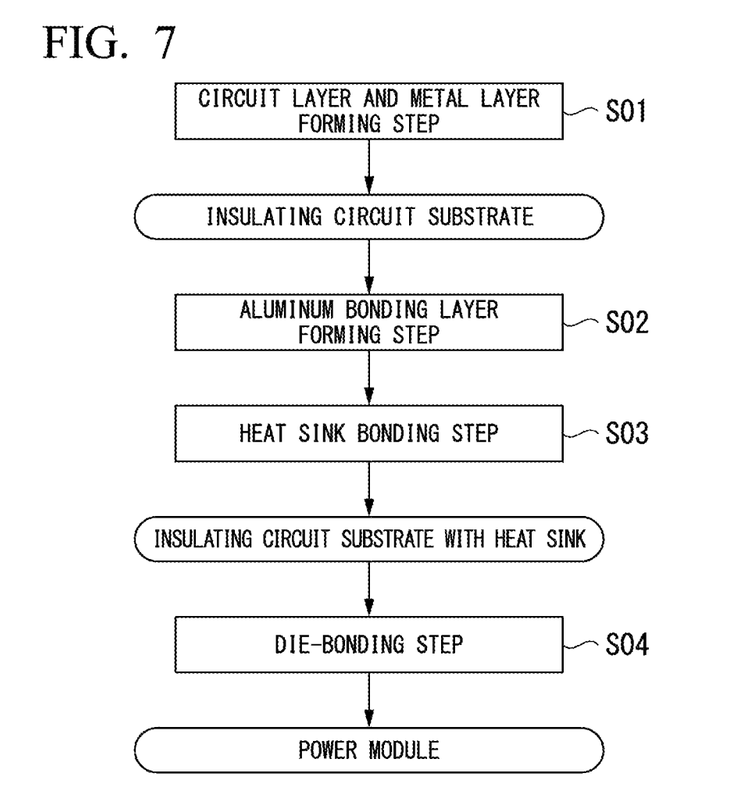
FIG. 7 is a flowchart illustrating a method for producing an insulating circuit substrate with a heat sink according to another embodiment of the present invention.
Figure 8:
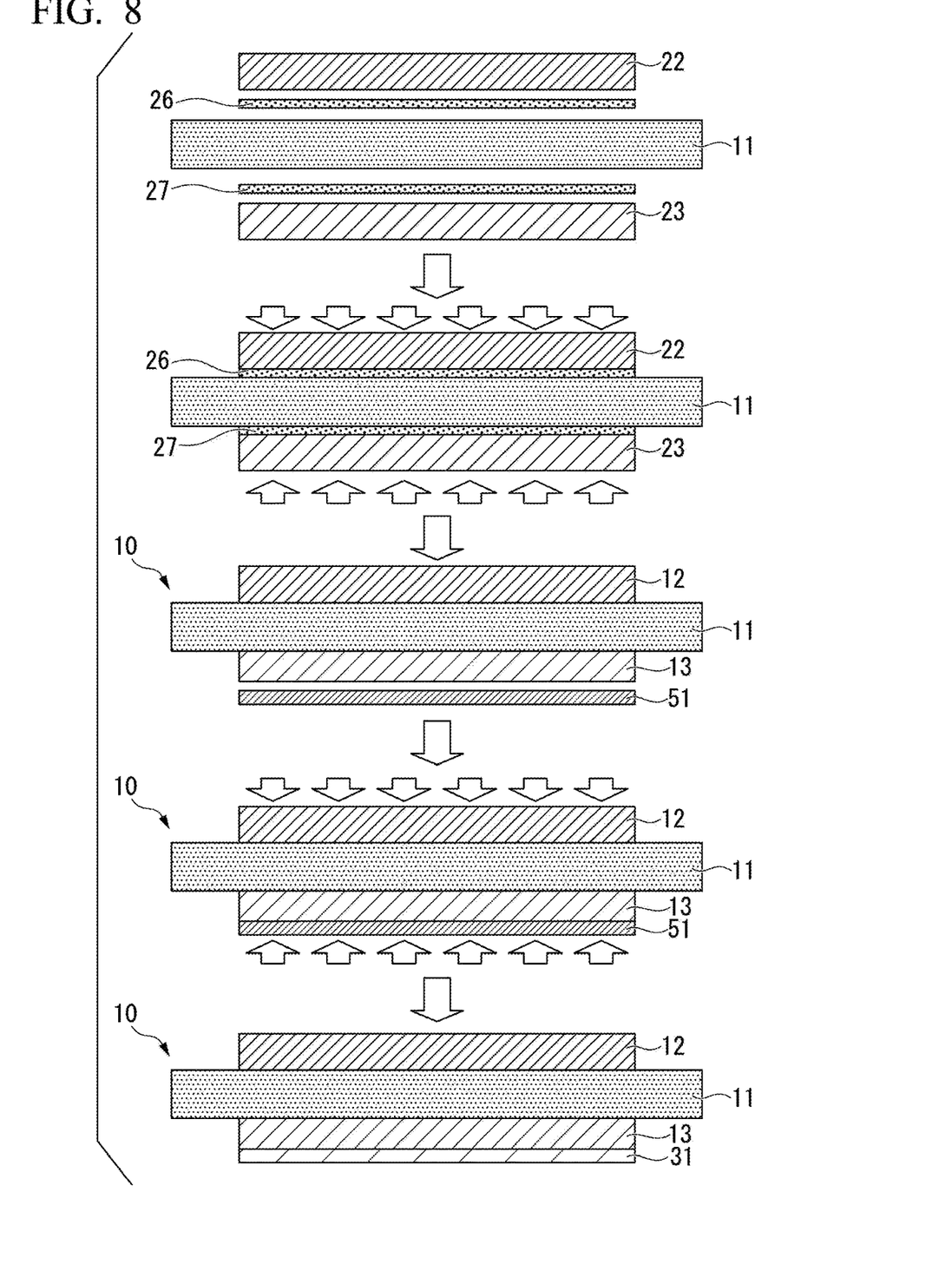
FIG. 8 is a cross-sectional view illustrating a method for producing an insulating circuit substrate with a heat sink according to another embodiment of the present invention.

As described above, when bonding is performed using a laminated brazing material in which Mg is laminated on an Al-Si brazing material or when solid phase diffusion bonding is performed, as illustrated in FIGS. 7 and 8, the aluminum bonding layer forming step S02 is performed after performing the circuit layer and metal layer forming step S01 to produce the insulating circuit substrate 10.

That is, in the circuit layer and metal layer forming step S01, the aluminum plates 22 and 23 are laminated on the first surface and the second surface of the ceramic substrate 11 via the brazing materials 26 and 27. By heating the laminated body under a vacuum condition in a state where the laminated body is pressurized in the laminating direction, the ceramic substrate 11 and the aluminum plates 22 and 23 are bonded to each other to form the circuit layer 12 and the metal layer 13. It is preferable that bonding conditions in the circuit layer and metal layer forming step S01 be set as follows: the degree of vacuum is in a range of $10^{-6}$ Pa to $10^{-3}$ Pa, the pressurization load is in a range of 0.1 MPa to 3.5 MPa, and the heating temperature is in a range of 560° C. to 655° C. As the brazing materials 26 and 27, an Al-Si brazing material is preferably used.

As illustrated in FIG. 8, by laminating the aluminum plate 51 that forms the aluminum bonding layer 31 on a second surface side (in FIG. 8 a lower side) of the metal layer 13 of the insulating circuit substrate 10 and bonding the metal layer 13 of the insulating circuit substrate 10 and the aluminum plate 51 to each other under the above-described conditions, the aluminum bonding layer 31 is formed. Next, as illustrated in FIG. 6, by bonding the heat sink 41, the insulating circuit substrate with a heat sink 40 is produced.

EXAMPLES

Hereinafter, an experiment for verifying the effectiveness of the present invention will be described. A circuit layer (37 mm×37 mm×thickness 0.4 mm) formed of aluminum (4N aluminum) having a purity of 99.99 mass % or higher was formed on a first surface of a ceramic substrate (40 mm×40 mm×thickness 0.635 mm) formed of aluminum nitride (AlN). A metal layer (37 mm×37 mm) formed of a material shown in Table 1 and having a thickness shown in Table 1 was formed on a second surface of the ceramic substrate. The ceramic substrate and the aluminum plates forming the circuit layer and the metal layer were bonded to each other using an Al-7.5 mass % Si brazing material foil (thickness 12 μm) in a vacuum atmosphere ($3 \times 10^{-3}$ Pa) under conditions of pressurization load: 6 MPa, heating temperature: 645° C., and holding time: 45 min.

An aluminum bonding layer (37 mm×37 mm) formed of a material shown in Table 1 and having a thickness shown in Table 1 was formed on the insulating circuit substrate. When the aluminum bonding layer was formed of A3003 alloy, bonding was performed using a clad material of A3003 alloy and A4045 alloy in a nitrogen atmosphere under conditions of pressurization load: 1.2 MPa, heating temperature: 630° C., and holding time: 45 min.

When the aluminum bonding layer was formed of ADC12, bonding was performed in a vacuum atmosphere ($6 \times 10^{-4}$ Pa) under conditions of heating temperature: 500° C. and pressurization load: 20 MPa.

When the aluminum bonding layer was formed of 4N—Al, an Al-7.5 mass % Si brazing material foil (thickness 12 μm) was provided between the metal layer and the 4N—Al plate forming the aluminum bonding layer, and bonding was performed in a vacuum atmosphere ($6 \times 10^{-4}$ Pa) under conditions of heating temperature: 645° C. and pressurization load: 6 MPa.

A heat sink (50 mm×60 mm×thickness 5.0 mm/thickness of skin layer: 0.1 mm) formed of an Al—SiC composite material (so-called AlSiC) in which aluminum having a solidus temperature shown in Table 2 was impregnated into a porous body of SiC was laminated on the aluminum bonding layer via a copper bonding material (rolled plate of oxygen free copper: 37 mm×37 mm×thickness 1.0 mm). This laminated body was pressurized in a laminating direction at 21 MPa and was held at 490° C. for 150 min such that the aluminum bonding layer and the copper bonding material were bonded to each other and the copper bonding material and the heat sink were bonded to each other by solid phase diffusion bonding.

When the material of the heat sink in Table 2 was 4N—Al, an aluminum plate (50 mm×60 mm×thickness 5.0 mm) having a purity of 99.99 mass % or higher (4N—Al) was used.

The obtained insulating circuit substrate with a heat sink was evaluated for the respective items in the following order.

(Measurement of Indentation Hardness)

The indentation hardness of the metal layer of the insulating circuit substrate with a heat sink was measured using a nanoindentation method. 10 measurement points for equally dividing the metal layer into 12 portions in a thickness direction were selected, the indentation hardnesses of the respective measurement points were measured, and the average value thereof was calculated. In order to measure the indentation hardness, a load-displacement relation was measured with a method according to ISO 14577 when a negative pressure was applied at a test load of 5000 mgf using a triangular pyramidal diamond indenter called a Berkovich indenter having a dihedral angle of 114.8° to 115.1°. The indentation hardness was obtained from the expression Indentation Hardness=$37.926 \times 10^{-3}$ (load [mgf] ÷displacement [μm]$^2$).

(Bonding State)

An ultrasonic-detected image of a interface between the copper bonding material and a member formed of aluminum having a higher solidus temperature among the aluminum (in the case of AlSiC, the impregnated aluminum) forming the heat sink and the aluminum forming the aluminum bonding layer was measured using an ultrasonic flaw detector (Fine Sat 200, manufactured by Hitachi Power Solutions Co., Ltd.), and a bonding rate was calculated from the following expression. An initial bonding area refers to the area to be bonded before bonding, that is, the area of the copper bonding material.

(Bonding Rate)={(Initial Bonding Area)−(Exfoliation Area)}/(Initial Bonding Area)

In an image obtained by binarizing the ultrasonic-detected image, exfoliation is represented by a white portion in the bonding layer. Therefore, the area of the white portion was set as the exfoliation area. A case where the bonding rate was 90% or higher was evaluated as "o", and a case where the bonding rate was lower than 90% was evaluated as "x".

(Cracking of Ceramic Substrate)

3000 thermal cycles of −40° C.↔150° C. were performed on the insulating circuit substrate with a heat sink, and the ceramic substrate was observed using an ultrasonic flaw detector after the thermal cycles. A case where cracking did not occur was evaluated as "o", and a case where cracking occurred was evaluated as "x".

TABLE 1

| | Metal Layer | | | Aluminum Bonding Layer | | | | |
| --- | --- | --- | --- | --- | --- | --- | --- | --- |
| | Material | Indentation Hardness (mgf/μm$^2$) | Thickness tb (mm) | Material | Solidus Temperature (° C.) | Thickness ta (mm) | tb/ta | ta + tb |
| Example 1 | 4N—Al | 40 | 0.30 | A3003 | 643 | 0.10 | 3.00 | 0.40 |
| Example 2 | 4N—Al | 42 | 0.20 | A3003 | 643 | 0.20 | 1.00 | 0.40 |
| Example 3 | 4N—Al | 43 | 0.10 | A3003 | 643 | 0.30 | 0.33 | 0.40 |
| Example 4 | 4N—Al | 40 | 0.35 | A3003 | 643 | 0.05 | 7.00 | 0.40 |
| Example 5 | 4N—Al | 44 | 0.07 | A3003 | 643 | 0.33 | 0.21 | 0.40 |
| Example 6 | 4N—Al | 44 | 0.05 | A3003 | 643 | 0.35 | 0.14 | 0.40 |
| Example 7 | 4N—Al | 45 | 0.03 | A3003 | 643 | 0.37 | 0.08 | 0.40 |
| Example 8 | 4N—Al | 39 | 0.37 | A3003 | 643 | 0.03 | 12.33 | 0.40 |
| Example 9 | 4N—Al | 35 | 0.90 | A3003 | 643 | 0.30 | 3.00 | 1.20 |
| Example 10 | 4N—Al | 35 | 1.20 | A3003 | 643 | 0.40 | 3.00 | 1.60 |
| Example 11 | 4N—Al | 34 | 1.50 | A3003 | 643 | 0.50 | 3.00 | 2.00 |
| Example 12 | 4N—Al | 34 | 1.95 | A3003 | 643 | 0.05 | 39.00 | 2.00 |
| Example 13 | 4N—Al | 38 | 0.50 | A3003 | 643 | 1.50 | 0.33 | 2.00 |
| Example 14 | 4N—Al | 39 | 0.40 | A3003 | 643 | 1.60 | 0.25 | 2.00 |
| Example 15 | 4N—Al | 40 | 0.30 | ADC12 | 570 | 0.10 | 3.00 | 0.40 |
| Example 16 | 4N—Al | 40 | 0.30 | A6063 | 616 | 0.10 | 3.00 | 0.40 |
| Example 17 | 4N—Al | 40 | 0.30 | A3003 | 643 | 0.10 | 3.00 | 0.40 |
| Example 18 | 2N—Al | 49 | 0.30 | A3003 | 643 | 0.10 | 3.00 | 0.40 |
| Example 19 | 4N—Al | 40 | 0.30 | A3003 | 643 | 0.10 | 3.00 | 0.40 |
| Comparative Example 1 | A3003 | 58 | 0.30 | A3003 | 643 | 0.10 | 3.00 | 0.40 |
| Comparative Example 2 | 4N—Al | 40 | 0.30 | — | — | — | — | 0.30 |
| Comparative Example 3 | 4N—Al | 40 | 0.30 | A3003 | 643 | 0.10 | 3.00 | 0.40 |
| Comparative Example 4 | 4N—Al | 40 | 0.30 | 4N—Al | 660 | 0.10 | 3.00 | 0.40 |

TABLE 2

| | Heat Sink | | Difference in Solidus Temperature between Aluminum Bonding Layer and Heat Sink | Evaluation | |
|---|---|---|---|---|---|
| | Material | Solidus Temperature (° C.) | | Bonding State | Cracking of Ceramic Substrate |
| Example 1 | AlSiC | 570 | 73 | ○ | ○ |
| Example 2 | AlSiC | 570 | 73 | ○ | ○ |
| Example 3 | AlSiC | 570 | 73 | ○ | ○ |
| Example 4 | AlSiC | 570 | 73 | ○ | ○ |
| Example 5 | AlSiC | 570 | 73 | ○ | ○ |
| Example 6 | AlSiC | 570 | 73 | ○ | ○ |
| Example 7 | AlSiC | 570 | 73 | ○ | ○ |
| Example 8 | AlSiC | 570 | 73 | ○ | ○ |
| Example 9 | AlSiC | 570 | 73 | ○ | ○ |
| Example 10 | AlSiC | 570 | 73 | ○ | ○ |
| Example 11 | AlSiC | 570 | 73 | ○ | ○ |
| Example 12 | AlSiC | 570 | 73 | ○ | ○ |
| Example 13 | AlSiC | 570 | 73 | ○ | ○ |
| Example 14 | AlSiC | 570 | 73 | ○ | ○ |
| Example 15 | AlSiC | 570 | 0 | ○ | ○ |
| Example 16 | AlSiC | 570 | 46 | ○ | ○ |
| Example 17 | AlSiC | 616 | 27 | ○ | ○ |
| Example 18 | AlSiC | 570 | 73 | ○ | ○ |
| Example 19 | AlSiC | 650 | 7 | ○ | ○ |
| Comparative Example 1 | AlSiC | 570 | 73 | ○ | X |
| Comparative Example 2 | AlSiC | 570 | — | X | ○ |
| Comparative Example 3 | 4N—Al | 660 | 17 | X | ○ |
| Comparative Example 4 | AlSiC | 570 | 90 | X | ○ |

In Comparative Example 1 in which the indentation hardness of the metal layer was 50 mgf/μm² or higher, the cracking of the ceramic substrate occurred. In Comparative Example 2 in which the aluminum bonding layer was not provided, the bondability between the metal layer and the copper bonding material deteriorated. In Comparative Example 3 in which the heat sink was formed of aluminum having a solidus temperature of higher than 650° C., the bondability between the heat sink and the copper bonding material deteriorated. In Comparative Example 4 in which the aluminum bonding layer was formed of aluminum having a solidus temperature of higher than 650° C., the bondability between the aluminum bonding layer and the copper bonding material decreased.

On the other hand, in Examples 1 to 19, the insulating circuit substrate with a heat sink was obtained, in which the bondability between the aluminum bonding layer and the copper bonding material and the bondability between the heat sink and the copper bonding material were high, and the cracking of the ceramic substrate did not occur.

INDUSTRIAL APPLICABILITY

According to the present invention, a metal layer and a heat sink can be reliably bonded to each other by solid phase diffusion bonding even when the metal layer is formed of aluminum or an aluminum alloy having a relatively low deformation resistance and a bonding surface of the heat sink is formed of aluminum or an aluminum alloy having a relatively low solidus temperature. Therefore, the present invention is industrially applicable.

REFERENCE SIGNS LIST

10: INSULATING CIRCUIT SUBSTRATE
11: CERAMIC SUBSTRATE (INSULATING LAYER)
12: CIRCUIT LAYER
13: METAL LAYER
31: ALUMINUM BONDING LAYER
32: COPPER BONDING LAYER
40: INSULATING CIRCUIT SUBSTRATE WITH HEAT SINK
41: HEAT SINK
43: SKIN LAYER (BONDING SURFACE)
52: COPPER PLATE (COPPER BONDING MATERIAL)

The invention claimed is:

1. A method for producing an insulating circuit substrate with a heat sink including an insulating circuit substrate and a heat sink,
the insulating circuit substrate including a circuit layer that is formed on a first surface of an insulating layer and a metal layer that is formed on a second surface of the insulating layer,
the heat sink being bonded to the metal layer side of the insulating circuit substrate,
the metal layer being formed of aluminum having a purity of 99 mass % or higher,
an indentation hardness of the metal layer being lower than 50 mgf/μm²,
a bonding surface of the heat sink with the insulating circuit substrate being formed of aluminum or an aluminum alloy having a solidus temperature of 650° C. or lower, and
the method comprising:
a circuit layer and metal layer forming step of forming the circuit layer and the metal layer by laminating the circuit layer via a first brazing material on the first surface of the insulating layer, and laminating the metal layer via a second brazing material on the second surface of the insulating layer, in order to obtain the insulating circuit substrate;

an aluminum bonding layer forming step of forming an aluminum bonding layer formed of an aluminum alloy having a solidus temperature of 650° C. or lower on a surface of the metal layer opposite to the insulating layer; and a heat sink bonding step of bonding the heat sink to the aluminum bonding layer by laminating a copper bonding material formed of copper or a copper alloy between the aluminum bonding layer and the bonding surface of the heat sink and bonding the aluminum bonding layer and the copper bonding material to each other and bonding the copper bonding material and the heat sink to each other by solid phase diffusion bonding.

2. The method for producing the insulating circuit substrate with the heat sink according to claim 1,
wherein a ratio tb/ta of a thickness tb of the metal layer to a thickness to of the aluminum bonding layer is in a range of 0.08 to 40.

3. The method for producing the insulating circuit substrate with the heat sink according to claim 1,
wherein a total thickness of the metal layer and the aluminum bonding layer is 2.0 mm or less.

4. The method for producing the insulating circuit substrate with the heat sink according to claim 1,
wherein the insulating layer is a ceramic substrate formed of one or more selected from aluminum nitride (AlN), silicon nitride ($Si_3N_4$), and alumina ($Al_2O_3$) and has a thickness of 0.2 mm to 1.5 mm, the circuit layer is a rolled plate formed of aluminum having a purity of 99 mass % or higher or an aluminum alloy as A3003 or A6063 and has a thickness of 0.1 mm to 2.0 mm, the metal layer is formed of the aluminum (2N aluminum) having the purity of 99 mass % or higher, aluminum (3N aluminum) having a purity of 99.9 mass % or higher, or aluminum (4N aluminum) having a purity of 99.99 mass % or higher and has a thickness of 0.1 mm to 2.0 mm, the heat sink includes a heat sink main body that is formed of AlSiC and a skin layer that is formed of an aluminum material impregnated into a porous body and is formed on a surface of the heat sink main body, a thickness of the heat sink main body is 0.5 mm to 5.0 mm, and a thickness of the skin layer is 0.01 times to 0.1 times the thickness of the heat sink main body, a temperature difference between a solidus temperature of the aluminum bonding layer and a solidus temperature of the aluminum material forming the skin layer of the heat sink is 80° C. or lower, and a thickness of the aluminum bonding layer is 0.03 mm to 1.5 mm.

5. The method for producing the insulating circuit substrate with the heat sink according to claim 2,
wherein a total thickness of the metal layer and the aluminum bonding layer is 2.0 mm or less.

6. The method for producing the insulating circuit substrate with the heat sink according to claim 2,
wherein the insulating layer is a ceramic substrate formed of one or more selected from aluminum nitride (AlN), silicon nitride ($Si_3N_4$), and alumina ($Al_2O_3$) and has a thickness of 0.2 mm to 1.5 mm, the circuit layer is a rolled plate formed of aluminum having a purity of 99 mass % or higher or an aluminum alloy as A3003 or A6063 and has a thickness of 0.1 mm to 2.0 mm, the metal layer is formed of the aluminum (2N aluminum) having the purity of 99 mass % or higher, aluminum (3N aluminum) having a purity of 99.9 mass % or higher, or aluminum (4N aluminum) having a purity of 99.99 mass % or higher and has a thickness of 0.1 mm to 2.0 mm, the heat sink includes a heat sink main body that is formed of AlSiC and a skin layer that is formed of an aluminum material impregnated into a porous body and is formed on a surface of the heat sink main body, a thickness of the heat sink main body is 0.5 mm to 5.0 mm, and a thickness of the skin layer is 0.01 times to 0.1 times the thickness of the heat sink main body, a temperature difference between a solidus temperature of the aluminum bonding layer and a solidus temperature of the aluminum material forming the skin layer of the heat sink is 80° C. or lower, and a thickness of the aluminum bonding layer is 0.03 mm to 1.5 mm.

7. The method for producing the insulating circuit substrate with the heat sink according to claim 1,
wherein in the aluminum bonding layer forming step, a brazing material layer is provided between the metal layer and an aluminum alloy layer constituting the aluminum bonding layer, at least the metal layer, the brazing material layer, and the aluminum alloy layer are pressurized in a laminating direction and heated, to form the aluminum bonding layer on the surface of the metal layer opposite to the insulating layer.

* * * * *